United States Patent
Basheer et al.

[11] Patent Number: 5,891,367
[45] Date of Patent: Apr. 6, 1999

[54] CONDUCTIVE EPOXY ADHESIVE

[75] Inventors: Rafil Abdulkadir Basheer, Rochester, Mich.; Michael Stephen Zwolinski, Warren, Ohio

[73] Assignee: General Motors Corporation, Detroit, Mich.

[21] Appl. No.: 28,110

[22] Filed: Feb. 23, 1998

[51] Int. Cl.$^6$ ...................................................... H01B 1/22
[52] U.S. Cl. ............................ 252/514; 524/439; 528/93
[58] Field of Search ........................... 252/514; 524/439; 528/93

[56] References Cited

U.S. PATENT DOCUMENTS

| | | | |
|---|---|---|---|
| 4,557,860 | 12/1985 | DiSalvo et al. | 252/512 |
| 4,880,570 | 11/1989 | Sanborn et al. | 252/512 |
| 4,996,005 | 2/1991 | Saito et al. | 252/512 |
| 5,183,593 | 2/1993 | Durand et al. | 252/514 |
| 5,575,956 | 11/1996 | Hermansen et al. | 252/514 |

OTHER PUBLICATIONS

Botter et al, "Factors That Influence the Electrical Contact Resistance of Isotropic Conductive Adhesive Joints During Climate Chamber Testing," *Proceedings –Adhesives in Electronics '96* Conference, Jun. 3–5, 1996, Stockholm, Sweden, pp. 30–37.

McCarthy, "New Test Methods for Evaluating Electrically Conductive Adhesives," *J. Surface Mount Technology*, vol. 9, pp. 19–26, Jul. 1996.

Zwolinski et al, "Electrically Conductive Adhesives for Surface Mount Solder Replacement," *IEEE Transactions on Components, Packaging, and Manufacturing Technology —Part C*, vol. 19, No. 4, pp. 241–250, Oct. 1996.

Liu, "When Can We Use Conductive Adhesives in Volume Production —An Overview of Advances of Conductive Adhesive Joining Technology in electronics Applications," *Proceedings –International Seminar on Latest Achievements in Conductive Adhesive Joining in Electronics Packaging*, Sep. 5, 1995, Norrkoping, Sweden.

Jagt, "Reliability of Electrically Conductive Adhesive Joints for Surface Mount Applications," PEP '97 –The First IEEE International Symposium on Electronics Packaging, Oct. 26–30, 1997, Norrkoping, Sweden.

Wong et al, "Fundamental Study of Electrically Conductive Adhesive (ECAs)," PEP '97 –The First IEEE International Symposium on Electronics Packaging, Oct. 26–30, 1997, Norrkoping, Sweden.

*Primary Examiner*—Mark Kopec
*Attorney, Agent, or Firm*—George A. Grove

[57] ABSTRACT

An electrically-conductive epoxy resin is disclosed having stable joint resistance over extended operating times and high impact strength where the resin is based on a silver flake-filled polymeric reaction product of a liquid bisphenol A having very low hydrolyzable chlorine content and suitable polypropylene oxide-based primary amine curing agents.

6 Claims, 2 Drawing Sheets

CONDUCTIVE EPOXY ADHESIVE

TECHNICAL FIELD

This invention relates to electrically-conductive epoxy adhesives suitable, e.g., for bonding circuit components to a substrate. More specifically, this invention pertains to such adhesives having stable joint resistance and high impact strength.

BACKGROUND OF THE INVENTION

Production of electronic modules typically involves an electrical circuit patterned on a fiberglass/epoxy, ceramic, or flexible polymer substrate with copper or cermet conductors. The electrical functions are imparted through circuit components (i.e., transistors, resistors, capacitors, diodes, microprocessors) which are soldered to the surface of the board (Surface Mount Technology) or soldered in holes through the board (Through Hole Technology). Constructions of this sort are widely used in many industries: automotive, telecommunications, entertainment, military and computers. Automotive applications of circuit boards with soldered components include engine control modules, ignition modules, instrument panel controls, radios, electrical centers, and various other accessory and convenience modules.

The leading technique used throughout the electronics industry for soldering components to the substrate uses a metallic solder alloy containing, by weight, 63% tin/37% lead. It is applied to the circuit board either as a paste which is heated to more than 200° C. to "reflow" the paste into a solder joint. Alternatively, the board is passed over a molten wave of solder to form joints to bond the electrical components to the circuit board. In either case, a flux material consisting of weak acids is used to remove surface oxidation from metallic surfaces and allow the molten solder to bond to the surfaces and form reliable solder joints.

While this solder attachment technology has existed for many decades, it does have some notable shortcomings. One issue is the lead in the alloy. Lead has already been banned from paint, gasoline, and plumbing solders for environmental and safety reasons. Numerous environmental regulations have been proposed to tax, limit, or ban the use of lead in electronic solders. A second shortcoming is the use of the above mentioned flux material for removing surface oxides. This flux leaves a residue on the finished parts that must be cleaned off with a solvent spray. This is an expensive and often inefficient process. In addition to lead and flux, the solder needs to be processed at temperatures above 200° C. This temperature often dictates the use of an expensive substrate in order to withstand the soldering process temperature, even though the assembly will never encounter temperatures nearly as high in the rest of its service life. In certain high temperature automotive applications (i.e., engine compartment locations where temperature can reach 175° C.), the conventional tin/lead solder may not be usable since the service temperature is dangerously close to the melting point of the alloy. Yet another shortcoming of solder is that the metallic alloy is a brittle material that can crack after repeated thermal cycling. In cases where expansion rates of component and substrate are vastly different, cracked solder joints may be a significant problem.

There are two main alternatives to the existing tin/lead solders. One is a lead-free metallic solder alloy and the other is an electrically conductive synthetic resin adhesive. In the family of metallic solders, many lead free alloys exist including, tin, silver, indium, bismuth, copper and antimony among other metals. Numerous research efforts have evaluated lead free alloys, but have found no lead free solders that directly match the properties of the existing 63% tin/37% lead alloy in use today. Issues for lead free solders include: higher process temperature (which may require redesigned circuit boards and electrical components), different mechanical properties, longer processing times and more sensitivity to assembly process parameters.

The second alternative, electrically conductive adhesives, offer several advantages over traditional solder assembly including: absence of lead, low processing temperatures, no need for solder flux or subsequent flux cleaning steps, improved mechanical properties, better high temperature performance, and a simplified assembly process. Conductive adhesives have been on the market for several decades and are widely used in sealed semiconductor packages. However, use of conductive adhesives for unsealed circuit boards represents a new application for adhesives.

Several international research efforts (IVF-Sweden, Delta-Denmark) have evaluated conductive adhesives as a solder replacement. They have reported successful results for niche applications but have not identified a drop-in solder replacement. The technology is limited by electrical resistance stability through temperature/humidity aging and impact strength.

In the US, the National Center for Manufacturing Sciences (NCMS) performed an extensive evaluation of electrically conductive adhesives for surface mount printed circuit applications. In that cooperative industry project, over 30 commercially available adhesives were evaluated for basic electrical and mechanical properties. The NCMS team defined a test method for evaluating electrical resistance of a conductive adhesive joint as well as an impact test to assess the capability of these adhesives for holding a component on a circuit board during an impact (S. L. McCarthy, "New Test Methods for Evaluating Electrically Conductive Adhesives," J. Surface Mount Technology, Vol. 9, July 1996, pp. 19–26). The electrical testing was performed before and after exposure to an elevated temperature/humidity environment (85° C., 85%RH) and was conducted with copper parts and tin/lead parts. The testing revealed that some adhesives had adequate electrical resistance when copper surfaces were used. On the other hand, no adhesives were identified for producing adequate resistance with tin/lead surfaces. Impact testing also concluded that no adhesives were capable of meeting the NCMS impact test requirement. The use of present conductive adhesives for surface mount component attachment to printed circuit boards is very limited because the impact strength and electrical resistance stability that they provide has fallen far short of the industry standard tin/lead solder performance.

Previous testing of commercially available adhesives has concluded that conductive adhesives are suitable for only niche applications, limited by resistance and impact requirements. Contact with commercial adhesive vendors has revealed that most have been stopped by the requirement for resistance stability on Sn/Pb surfaces. Some vendors have claimed success at developing an impact resistant adhesive, but none have been able to address the resistance variability when in contact with tin/lead layers. In fact, many adhesive vendors have acknowledged that impact strength and resistance stability are mutually exclusive parameters. The conductive adhesives of this invention provide formulations with both impact and resistance properties that are comparable to or exceed the performance of tin/lead solders. This combination of properties expands the window of application for conductive adhesives from limited niche applications to potential universal solder replacement in circuit board applications.

From a traditional viewpoint, cured epoxy resins are often thought of as rigid and brittle materials. This rigidity and brittleness are further magnified when fillers are added to accomplish certain desirable properties such as in the case of metal filled epoxy resins. Conventional epoxies filled with 70% to 80% silver flakes are highly conductive but very brittle and failure occurs even under a mild mechanical shock condition.

SUMMARY OF THE INVENTION

In accordance with this invention, epoxy formulations are provided that are both impact resistant and highly conductive with stable joint resistance after aging. These silver filled formulations are either elastic or rigid but highly toughened epoxy composites. The combination of such desirable properties is achieved by choice of curing agents, epoxy resin, and type and amount of silver flakes employed.

The epoxy resin starting material is a suitable bisphenol A/epichlorohydrin derived epoxy resin having an epoxy equivalent weight in the range of 170 to 280. The difunctional liquid epoxy has also been processed so as to have a very low hydrolyzable chlorine content of no more than 50 parts per million, and preferably no more than 30 parts per million. An example of a suitable resin is RSL-1462 from the Shell Chemical Company.

This epoxy resin is reacted or cured with certain specific primary amines in order to obtain the desired impact resistance and stable electrical resistance. Certain primary amines will be described as suitable for reaction with the above epoxy resin. It is to be understood that the total primary amine content is preferably stoichiometrically equivalent to the epoxy resin as characterized by its epoxy equivalent weight.

The primary amine content includes a polyoxypropylene diamine or polyoxypropylene triamine of molecular weight in the range of about 2000 to 5000. Examples of suitable diamines are the amine terminated polypropylene glycols. These are diamines with the primary amine groups at the ends of a polyoxypropylene chain of suitable length. Specific examples include Jeffamine™ polyoxypropylene amines having molecular weights of 2000 and 4000. Examples of polyoxypropylene triamines are propylene oxide-based triamines that are prepared by a reaction of propylene oxide with a triol initiator such as glycerine or trimethylolpropane. The glycerine triol initiators, for example, of the polyoxypropylene triamines are available in molecular weights in the 3000 to 5000 range. These relatively high molecular weight (i.e., 2000 to 5000) polyoxypropylene di and tri primary amines provide flexibility to the resulting epoxy resin.

Suitable lower molecular weight polyoxypropylene diamines or triamines in the molecular weight range of 230 to about 450 may be employed in combination with the higher molecular weight group to provide a suitable flexibility and strength to the adhesive Jeffamine D400, an amine-terminated polypropylene glycol having a molecular weight of about 400, and Jeffamine T403, a trimethylolpropane-initiated polyoxypropylene triamine having a molecular weight of about 440, are examples of suitable, relatively low molecular weight di- or triamines.

In addition to the polyoxypropylene-based di and tri primary amines, selected other diamines may be used such as triethylene glycol diamine and diethyl toluene diamine (DETDA). As stated above, it is preferred that the total amine content be substantially stoichiometrically equivalent to the bisphenol A content of the resin.

The bisphenol A epoxy resin-primary amine curing agents will be mixed with a quantity of silver metal flakes so that the metal flake content of the total resin-metal flake mixture is in the range of about 60 percent to about 85 percent by weight.

As is known, silver flakes are available in a wide range of physical properties including tap density, surface area and viscosity. The choice of silver flakes may be made from this wide range of materials and incorporated in substantial quantities into the epoxy resin precursors to obtain the desired impact and electrical resistance properties of the cured adhesive.

An accelerator, preferably a tertiary amine accelerator, will be employed to increase the polymeric reaction rate of the mixture during curing. Examples of suitable tertiary amine accelerators are dimethylamino methyl phenol (DMAMP) and N,N-dimethylbenzyl amine.

Depending upon the physical properties of the silver flake that is incorporated for conductivity, it may be also preferred to add a flexibilizing additive. An example of a suitable flexibilizer for the silver flake-filled epoxy resin is an acrylate group terminated urethane flexibilizer that is available under the trade designation Ancarez 2364 from Air Products Corporation. As will be further described below, certain dipropanamine adducts may also be employed as flexiblizing curing agents.

Other objects and advantages of the invention will become more apparent from a detailed description thereof which follows. Reference will be had to the drawings in which:

DESCRIPTION OF PREFERRED EMBODIMENTS

Figure 1:
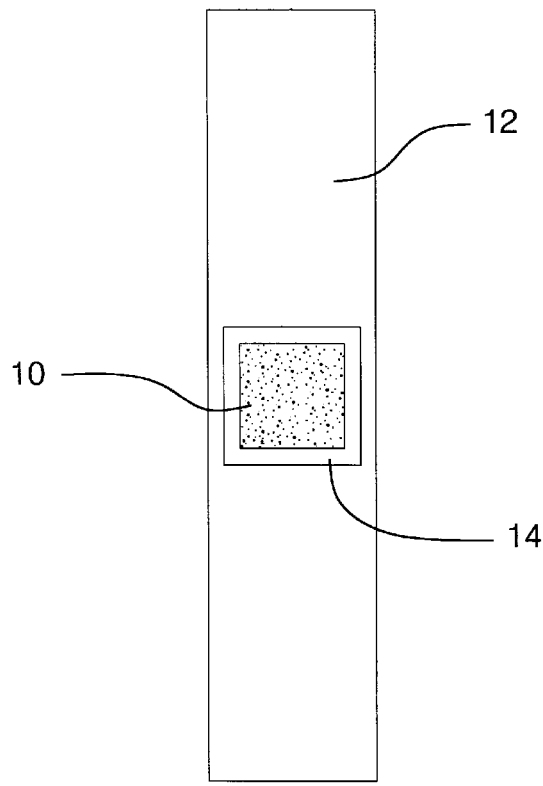
FIG. 1 is a plan view of a plastic leaded chip carrier mounted on a standard polyimide coupon with a conductive adhesive for drop test impact testing.

The materials used in these specific embodiments and their manufacturing sources are shown in Tables 1 and 2. They represent examples of suitable components for the practice of this invention. The resin side of all the formulations is a liquid bisphenol A-based difunctional epoxy resin having an epoxy equivalent weight in the range of 170 to 280 and a low level of hydrolyzable chloride, <50 ppm and preferably <30 ppm. An example of a suitable epoxy resin starting material is RS1462 Resin™ of Shell Chemical Company.

TABLE 1

Material Specifications and Sources

| Material (TM) | Composition | Symbol | Source |
|---|---|---|---|
| Jeffamine D400 | Polyoxypropylenediamine, M.Wt. ≈ 400 | D400 | Huntsman Corp. |
| Jeffamine D2000 | Polyoxypropylenediamine, M.Wt. ≈ 2000 | D2000 | Huntsman Corp. |
| Jeffamine T403 | Polyoxypropylenetriamine, M.Wt. ≈ 403 | T403 | Huntsman Corp. |
| Jeffamine T5000 | Polyoxypropylenetriamine, M.Wt. ≈ 5000 | T5000 | Huntsman Corp. |
| EDR148 | Triethylene Glycoldiamine, M.Wt. ≈ 148 | EDR148 | Huntsman Corp. |
| Accelerator 399 | Unknown | ACC399 | Huntsman Corp. |
| Ancarez 2364 | Acrylate terminated Urethane | Ancarez | Air Products Corp. |
| Ancamine 1110 | Dimethylaminomethylphenol | DMAMP | Air Products Corp. |
| Actiron NX-91 | N,N-Dimethylbenzylamine | NX-91 | Synthron Inc. |
| YSE-Cure N001 | 2,4,8,10-tetraoxaspiro (5,5) undecane-3,9-dipropanamine adduct with 2-propenenitrile | N001 | Ajinomoto USA, Inc. |
| YSE-Cure B001 | 2,4,8,10-tetraoxaspiro (5,5) undecane-3,9-dipropanamine adduct with (butoxymethyl) oxirane | B001 | Ajinomoto USA, Inc. |
| RSL1462 Resin | Bisphenol A-based Epoxy Resin | RSL1462 | Shell Chemical Co. |
| Ethacure 100 | Diethyltoluenediamine | DETDA | Albemarle Corp. |

TABLE 2

Silver Flakes Specifications

| Silver Flakes | Tap Density (g/cm$^3$) | Surface Area (m$^2$/g) | Viscosity | Manufacturer |
|---|---|---|---|---|
| SF-134 | 2–2.8 | 0.6–1.1 | high | Technic Inc. |
| SF-235 | 2.5–4 | 0.6–1.2 | medium | Technic Inc. |
| SF-299 | 2.8–4.2 | 0.3–0.8 | medium | Technic Inc. |
| SF-350 | 2.0–3.2 | 0.3–0.9 | high | Technic Inc. |
| SF-450 | 1.8–3.0 | 0.6–1.2 | high | Technic Inc. |
| SF-499 | 2.7–6.4 | 0.25–0.75 | low | Technic Inc. |
| SF-80 | 3.2–5.0 | 0.4–0.7 | medium | Degussa |
| SF-85 | 3.1–4.9 | 0.5–0.75 | medium | Degussa |
| SF-95 | 3.2–5.0 | 0.8–1.3 | medium | Degussa |
| SF-26LV | 4.0–5.8 | 0.08–0.3 | low | Degussa |
| SF-1 | 3.7–4.2 | 0.52–0.64 | medium | Degussa |

The curing agents are a variety of mixtures of primary polyamines (variable molecular weights), primary amine adducts, tertiary amines, and aromatic amines. Conductive epoxy adhesive composites with a wide range of properties, from very soft and elastic to rigid with a high degree of toughness, are formed by varying the composition of curing agents and the conductive silver flakes incorporated in the formulations.

In illustration of the practice of the invention, many different bisphenol A-based epoxy resin adhesive formulations were prepared. The compositions of these formulations are tabulated in Tables 3 through 6.

The procedure of making these formulations involves mixing the curing agents separately, followed by the addition of the curing agent mixture to the epoxy resin with continuous mixing. The silver flakes are then added in several portions, accompanied by a thorough mixing after each addition. Depending on the composition of the conductive epoxy formulations, particularly the physical characteristics of the silver flakes, the mixture before curing displays a range of consistencies from a creamy and smooth liquid to a thick paste. In all of the following exemplary formulations, stoichiometric ratios of bisphenol A and primary amines were employed. Deviations from stoichiometric concentrations may also be utilized to produce composites with desirable properties. The concentration of each primary amine in the formulations is given as a percent of total amine curing agents (not including the accelerator or hardener, or the amine adducts, when applicable), from which values the stoichiometric weight of each primary amine is determined per 100 parts of epoxy resin based on the epoxy group equivalent weight (EEW) for the suitable low chloride content bisphenol A epoxy resin. The EEW of RSL. 1462, e.g., is 188.

Each primary amine epoxy curing agent (ECA) has an amine hydrogen equivalent weight (AHEW). The weight of amine in parts per 100 parts of bisphenol A epoxy resin is phr (ECA)=100×AHEW/EEW. Except where otherwise noted, the following formulation tables state the epoxy resin, RSL 1462, as 100 parts by weight. The formulation entries of the primary amines, e.g., D2000 and D400, are stated as percentages of total primary amine content in the primary amine mixture—the total primary amine content being stoichiometrically equivalent to the RSL 1462 epoxy resm.

The amount of tertiary amine hardener or accelerator, e.g., DMAMP, or other hardener is entered as a percentage of the total primary amine content. For example, in formulation B1, Table 4, the amount (7.35 phr) of DMAMP accelerator was 7% of the total weight of the primary amine mixture (105 phr) which consisted of 73.5 phr D2000 and 31.5 phr T403.

The weight percentage of silver metal flake was based on the total resin-metal flake formulation.

As is illustrated in Table 2, silver metal flakes are available in a wide range of physical properties such as tap density (per ASTM B329-81), specific surface area (B.E.E. method) and viscosity. These materials are produced for electrically conductive inks and adhesives and the like. They are usually 99.9+% silver and are typically produced by flattening atomized silver powder. Such flakes for use in this invention have an average size (major axis) in the range of about 0.1 to 20 micrometers. Mixtures of different types of flakes may be used to achieve the desired combination of impact resistance and electrical resistance stability. Preferably, the silver content is about 60% to 85% be weight of the total metal-epoxy composition.

Impact testing and electrical measurements were conducted according to the methods described by S. L. McCarthy (see citation above). For impact testing, a 44J input/output (IO) plastic leaded chip device 10 (PLCC) was bonded to a piece of 1"×5" standard PWB copper laminated polyimide material 12 by a thin layer (6±1 mil) of a subject conductive epoxy adhesive 14 (FIG. 1). The assembly was then placed in a convection oven at 150° C. for 10–15 minutes to affect curing. To simulate mechanical shock to the bonded device, the assembly was dropped from a height of 60' on one edge of the polyimide coupon. The number of drops required to detach the PLCC device from the coupon was recorded as an industryrecognized measure of impact resistance.

Figure 2:
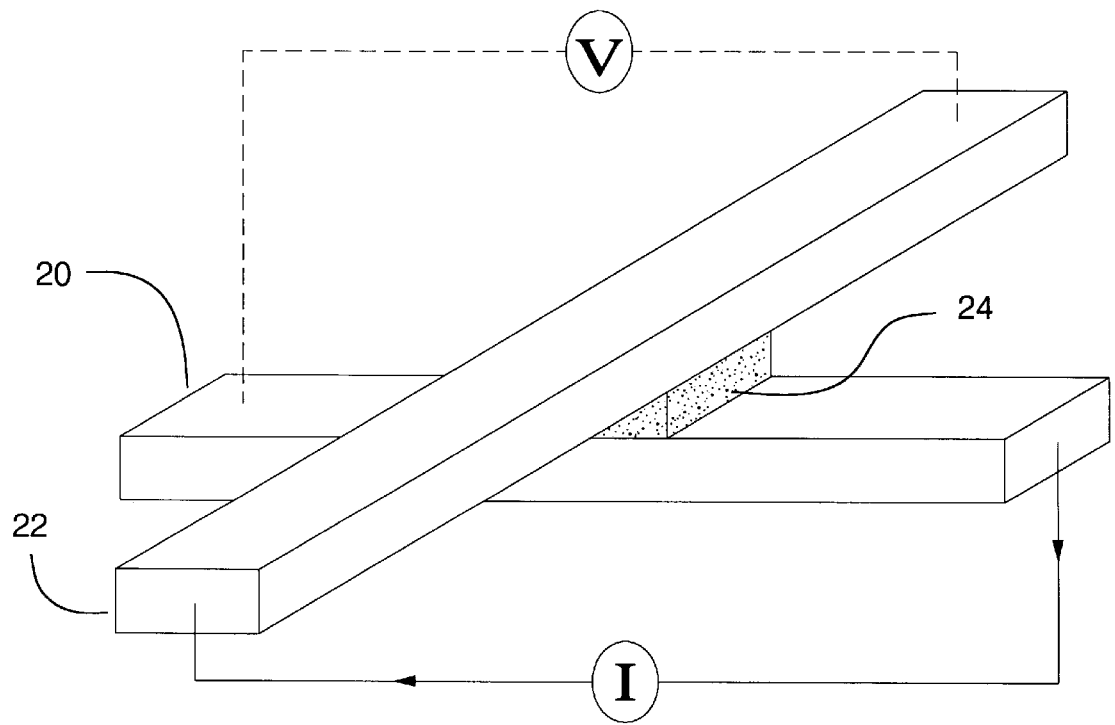
FIG. 2 is a perspective view of a four lead cross bridge assembly for testing the contact resistance of conductive adhesives.

The measurement of the electrical resistance was performed using two polished rectangular copper rods 20, 22 bonded in a cross configuration with (10 mil thick) conductive adhesive 24 (FIG. 2). Curing of the adhesive was carried out at 150° C. for 15 minutes. The cross bridge configuration of FIG. 2 allows for a four-point resistance measurement utilizing a current source I and a volt meter V. Surface finishes of copper and Sn/Pb were evaluated before and after aging for 500 hours at 85° C./85% relative humidity.

The disclosed conductive adhesive compositions are grouped in two categories, based on the curing agents. The first group involves curing the bisphenol A epoxy resin with a mixture of polyetheramines of varying molecular weights and functionalities and a tertiary amine (DMAMP), which acts as both hardener and accelerator. Examples of such formulations are given in Tables 3 and 4.

The second category involves the use of variable concentrations of aromatic amine (DETDA) as part of the curing system. The aromatic amines provide another convenient way of controlling the elastic and rigid characteristics of the cured adhesive. Examples of formulations containing aromatic amine are given in Tables 5 and 6.

TABLE 4

| | Formulation B1 | Formulation B2 | Formulation B3 | Formulation B4 |
|---|---|---|---|---|
| % D2000 | 70 | 70 | 80 | 80 |
| % T403 | 30 | 30 | 20 | 20 |
| % DMAMP | 7 | 7 | 10 | 10 |
| RSL 1462 | 100 | 100 | 100 | 100 |
| Silver | SF-299, 450[1] | SF-299, 450[1] | SF-80 | SF-26LV, 80, 450[2] |
| Wt. % Silver | 75 | 69 | 75 | 75 |
| Impact Resistance (mΩ) | 8 | 12 | 16 | 18 |
| Copper | | | | |
| Initial | 0.07 | 0.4 | 0.08 | 0.46 |
| Final | 0.13 | 0.12 | 0.21 | 1.4 |
| Sn/Pb | | | | |
| Initial | 1.1 | 2.4 | 0.9 | 1.8 |
| Final | 2.6 | 4.7 | 1.4 | 5.5 |

[1]80:20
[2]40:40:20

TABLE 3

FORMULATIONS

| | 11 | 12 | 13 | 14 | 15 | 16 | 17 | 18 | 19 |
|---|---|---|---|---|---|---|---|---|---|
| % D2000 | 75 | 75 | 75 | 75 | 75 | 75 | 75 | 85 | 85 |
| % T5000 | 10 | 10 | 10 | 10 | 10 | 10 | 10 | — | — |
| % D400 | 10 | 10 | 10 | 10 | 10 | 10 | 10 | 10 | 10 |
| % ERD148 | 5 | 5 | 5 | 5 | 5 | 5 | 5 | 5 | 5 |
| % DMAMP | 10 | 10 | 10 | 10 | 10 | 10 | 10 | 20 | 20 |
| Ancarez | — | — | — | — | — | — | — | — | 40 |
| RSL 1462 | 100 | 100 + 100 | 100 | 100 | 100 | 100 | 100 | 100 | 100 |
| N001 | — | 50 | — | — | — | — | — | — | — |
| Silver | SF-80 | SF-80 | SF-80, 450[1] | SF-299, 80[2] | SF-80, 26LV[2] | SF-299 | SF-299, 235[2] | SF-80 | SF-80 |
| Wt. % Silver | 75 | 75 | 75 | 75 | 75 | 75 | 75 | 75 | 75 |
| Impact Resistance (mΩ) | 7 | 12 | 10 | 13 | 26 | 11 | 9 | 9 | 17 |
| Copper | | | | | | | | | |
| Initial | 0.39 | 0.17 | 0.22 | 0.08 | 0.22 | 0.38 | 0.45 | 0.20 | 0.06 |
| Final | 0.11 | 0.88 | 0.4 | 0.25 | 0.4 | 0.13 | 0.3 | 0.39 | 0.08 |
| Sn/Pb | | | | | | | | | |
| Initial | 1.5 | 0.4 | 1.9 | 0.9 | 1.2 | 0.4 | 0.47 | 0.45 | 1.3 |
| Final | 3.3 | 0.69 | 5.2 | 3.8 | 4.8 | 3.5 | 1.8 | 1.9 | 2.3 |

[1]80:20
[2]50:50

TABLE 5

FORMULATIONS

| | H1 | H2 | H3 | H4 | H5 | H6 | H7 | H8 | H9 | H10 |
|---|---|---|---|---|---|---|---|---|---|---|
| % D2000 | 60 | 65 | 70 | 72 | 76 | 76 | 72 | 72 | 72 | 70 |
| % T403 | 25 | 20 | 20 | 10 | 8 | 8 | 10 | 10 | 10 | 20 |
| % DETDA | 5 | 5 | 5 | 10 | 8 | 8 | 10 | 10 | 10 | 5 |
| % ERD148 | 10 | 10 | 5 | 8 | 8 | 8 | 8 | 8 | 8 | 5 |
| Ancarez | 40 | 40 | 40 | 40 | 40 | — | 80 | 40 | 40 | 80 |
| RSL 1462 | 100 | 100 | 100 | 100 | 100 | 100 | 100 | 100 | 100 | 100 |
| % DMAMP | 10 | 10 | 10 | 10 | 10 | 10 | 10 | 10 | 10 | 10 |
| N001 | — | — | — | — | — | — | — | — | — | — |
| NX91 | — | — | — | — | — | — | — | — | — | — |
| Silver | SF-80 | SF-80 | SF-80 | SF-80 | SF-80 | SF-80 | SF-80 | SF-80 | SF-80, 450[1] | SF-80 |
| Wt. % Silver | 75 | 75 | 75 | 75 | 75 | 75 | 74 | 72 | 72 | 75 |
| Impact Resistance (mΩ) | 5 | 6 | 6 | 9 | 11 | 6 | 17 | 17 | 13 | 17 |
| Copper | | | | | | | | | | |
| Initial | 0.1 | 0.16 | 0.38 | 0.2 | 0.16 | 0.2 | 0.04 | 0.25 | 0.32 | 0.31 |
| Final | 0.09 | 0.14 | 0.5 | 0.34 | 0.23 | 0.5 | 0.02 | 0.47 | 0.48 | 0.12 |
| Sn/Pb | | | | | | | | | | |
| Initial | 0.33 | 1.1 | 1.6 | 1.4 | 1.6 | 1.5 | 0.9 | 0.63 | 0.67 | 4.5 |
| Final | 0.5 | 1.6 | 2.6 | 4.4 | 2.65 | 3.1 | 2.8 | 1.25 | 1.65 | 8 |

[1]80:20

| | H11 | H12 | H13 | H14 | H15 | H16 | H17 | H18 | H19 | H20 |
|---|---|---|---|---|---|---|---|---|---|---|
| % D2000 | 60 | 60 | 60 | 60 | 60 | 60 | 85 | 70 | 60 | 60 |
| % T403 | 25 | 25 | 25 | 25 | 25 | 25 | 5 | 20 | 25 | 25 |
| % DETDA | 5 | 5 | 5 | 5 | 5 | 5 | 5 | 5 | 5 | 5 |
| % ERD 148 | 10 | 10 | 10 | 10 | 10 | 10 | 5 | 5 | 10 | 10 |
| Ancarez | 40 | 40 | 40 | 40 | — | 40 | 40 | 80 | 60 | 40 |
| RSL 1462 | 100 | 100 | 100 + 42 | 100 + 42 | 100 + 42 | 100 | 100 | 100 | 100 | 100 + 42 |
| % DMAMP | 10 | 10 | 10 | 10 | 10 | 10 | 10 | 10 | — | — |
| N001 | — | — | 21 | 21 | 21 | — | — | — | — | 21 |
| NX91 | — | — | — | — | — | — | — | — | 10 | 15 |
| Silver | SF-80 | SF-80 | SF-80 | SF-80 | SF-80 | SF-80 | SF-80 | SF-80, 26LV[1] | SF-80, 26LV, 450[2] | SF-80 |
| Wt. % Silver | 70 | 72 | 75 | 72 | 72 | 70 | 75 | 75 | 70 | 72 |
| Impact Resistance (mΩ) | 14 | 8 | 9 | 11 | 4 | 15 | 25 | 21 | 39 | 27 |
| Copper | | | | | | | | | | |
| Initial | 0.18 | 0.08 | 0.02 | 0.13 | 0.13 | 0.34 | 0.31 | 0.54 | 0.6 | 0.6 |
| Final | 0.21 | 0.03 | 0.01 | 0.15 | 0.5 | 0.26 | 0.31 | 0.51 | 0.67 | 0.2 |
| Sn/Pb | | | | | | | | | | |
| Initial | 1.3 | 0.96 | 0.8 | 0.6 | 0.5 | 9.1 | 2.5 | 3 | 12.5 | 8.8 |
| Final | 2.4 | 2.18 | 2.3 | 1 | 1.65 | 15.7 | 4.1 | 3.6 | 58 | 25 |

[1]80:20
[2]30:60:10

| | H21 | H22 | H23 |
|---|---|---|---|
| % D2000 | 60 | 60 | 72 |
| % T403 | 25 | 25 | 10 |
| % DETDA | 5 | 5 | 10 |
| % ERD148 | 10 | 10 | 8 |
| Ancarez | 40 | 40 | 80 |
| RSL 1462 | 100 + 42 | 100 + 42 | 100 |
| % DMAMP | — | — | — |
| N001 | 21 | 21 | — |
| NX91 | 15 | 15 | 20 |
| Silver | SF-26LV, 80[1] | SF-80, 26LV, 450[3] | SF-80 |
| Wt. % Silver | 75 | 75 | 75 |
| Impact Resistance (mΩ) | 13 | 19 | 20 |
| Copper | | | |
| Initial | 0.58 | 0.58 | 0.18 |
| Final | 0.13 | 0.36 | 0.16 |

TABLE 5-continued

FORMULATIONS

Sn/Pb

| | Initial | 2.6 | 1.4 | 2.9 |
|---|---|---|---|---|
| | Final | 5.7 | 2.7 | 9.8 |

[1]50:50
[3]60:30:10

TABLE 6

| | FORMULATIONS | | | | | | |
|---|---|---|---|---|---|---|---|
| | N1 | N2 | N3 | N4 | N5 | N6 | N7 |
| % T5000 | 70 | 70 | 70 | 70 | 70 | — | — |
| % D400 | 20 | 20 | 20 | 20 | 20 | 15 | 15 |
| % D2000 | — | — | — | — | — | 70 | 70 |
| % DETDA | 10 | 10 | 10 | 10 | 10 | 15 | 15 |
| RSL 1462 | 100 | 100 | 100 | 100 | 100 | 100 | 100 |
| % DMAMP | 10 | — | — | 14 | 14 | 14 | 14 |
| ACC 399 | — | 14 | — | — | — | — | — |
| NX91 | — | — | 10 | — | — | — | — |
| Ancarez | — | — | — | 40 | 40 | — | 40 |
| Silver | SF-80 | SF-80 | SF-80 | SF-80 | SF-80, 26LV[1] | SF-80 | SF-80 |
| Wt. % Silver | 75 | 75 | 75 | 75 | 75 | 75 | 75 |
| Impact Resistance (mΩ) | 9 | 9 | 23 | 19 | 21 | 13 | 15 |
| Copper | | | | | | | |
| Initial | 0.38 | — | 0.3 | 0.7 | 0.42 | — | 0.25 |
| Final | 0.78 | — | 0.76 | 0.8 | 0.44 | — | 0.21 |
| Sn/Pb | | | | | | | |
| Initial | 0.77 | — | 1.9 | 1.3 | 2.3 | — | 1.5 |
| Final | 1.65 | — | 5.2 | 3.1 | 4.6 | — | 3.2 |

[1]50:50

The polyetheramines (Table 1) curing agents are well suited for the preparation of impact resistant epoxy formulations. The presence of the propylene ether functionality in the backbone results in cured epoxy with a high degree of flexibility and toughness. The low molecular weight members, such as EDR148, D230, D400, and T403, provide rigid but tough cured epoxies. In highly filled compositions, such as in conductive adhesives, however, these low molecular weight polyetheramines, when used to cure bisphenol A epoxy resins, do not produce adhesives with sufficient resistance to impact stresses. Flexibility and toughness substantially increase with the introduction of higher molecular weight polyetheramines such as D2000 and T5000. Such effects are shown in Table 7, where increasing the amount of D2000 relative to the lower molecular weight polyetheramines leads to improvement in the impact resistance characteristics. This is achieved without adversely affecting the electrical properties of the materials.

TABLE 7

Impact and Resistance Values as Functions of Long Chain Diamine (D2000)

| | | Resistance (mΩ) | | | |
|---|---|---|---|---|---|
| | | Cu | | Sn/Pb | |
| % D2000 | Impact | initial | final | initial | final |
| 60 | 5 | 0.1 | 0.09 | 0.33 | 0.5 |
| 65 | 6 | 0.16 | 0.14 | 1.1 | 1.6 |
| 70 | 6 | 0.38 | 0.5 | 1.6 | 2.6 |
| 72 | 9 | 0.2 | 0.34 | 1.4 | 4.4 |
| 76 | 11 | 0.16 | 0.23 | 1.6 | 2.65 |
| 85 | 25 | 0.31 | 0.31 | 2.5 | 4.1 |

Formulation contains D2000, T403, EDR148, DETDA, Ancarez, DMAMP, RSL1462, and SF-80 (75%).

Another aspect of this invention is the inclusion of amine adducts based on 2,4,8,10-tetraoxaspiro (5,5-undecane-3,9-dipropanamine) with 2-propenitrile or with butoxymethyl (N001 or B001, see Tables 3 and 5) as part of the total curing system. Since these amine adducts are primary amines, they function as curing agents or chain extenders for the bisphenol A epoxy resin. Therefore, it is preferred that an additional two parts by weight of bisphenol A epoxy per part by weight of N001 or B001 be employed to maintain stoichiometry. At the proper concentration, these adducts impart impact resistance characteristics to the cured conductive epoxy compositions. Examples of impact resistance enhancement are seen by comparing formulations I1 and I2, and H1 and H13. The electrical properties resulting from these formulations are as good as those obtained without the addition of these amine adducts.

Resistance to impact stresses may also be achieved by curing the epoxy resin in the presence of reactive flexibilizers. In this invention, we have found that the addition of acrylate terminated urethane flexibilizer (Ancarez 2364) to the epoxy resin-polyamine formulations provide conductive epoxy adhesives with properties ranging from very tough, resilient with high hardness to highly flexible and tough, depending on the level of Ancarez employed. These characteristics are reflected in the superior impact properties resulting from this treatment, as seen in the examples of Table 8.

TABLE 8

Impact and Resistance Values as Functions of Ancarez

| | | | Resistance (mΩ) | | | |
|---|---|---|---|---|---|---|
| | Ancarez | | Cu | | Sn/Pb | |
| % D2000 | (g/100 g resin) | Impact | initial | final | initial | final |
| 76 | 0 | 6 | 0.2 | 0.58 | 1.5 | 3.1 |
| 76 | 40 | 11 | 0.16 | 0.28 | 1.6 | 2.65 |
| 72 | 40 | 9 | 0.2 | 0.34 | 1.4 | 4.4 |
| 72 | 80 | 17 | 0.04 | 0.02 | 0.9 | 2.8 |
| 70 | 40 | 6 | 0.38 | 0.5 | 1.6 | 2.6 |
| 70 | 80 | 17 | 0.31 | 0.12 | 4.5 | 8.0 |

Formulation contains D2000, T403, DETDA, EDR148, Ancarez, RSL1462, DMAMP, and Silver SF-80 (75%).

The curing of bisphenol A-based epoxy resin with polyetheramine is rather slow, even at elevated temperatures. The addition of accelerator is therefore necessary. DMAMP was used in almost all formulations and at the concentration indicated based on the amount of total primary amine curing agents, not including amine adducts. It functions both as an accelerator and as a hardener. Other materials may also be used to substitute for DMAMP. For example, NX91, which is a slower reacting accelerator, gives more flexible conductive epoxy formulations with good impact properties, but not as good electrical properties. Accelerator 399 behaves more like DMAMP (Tables 5 and 6).

Figure 3:
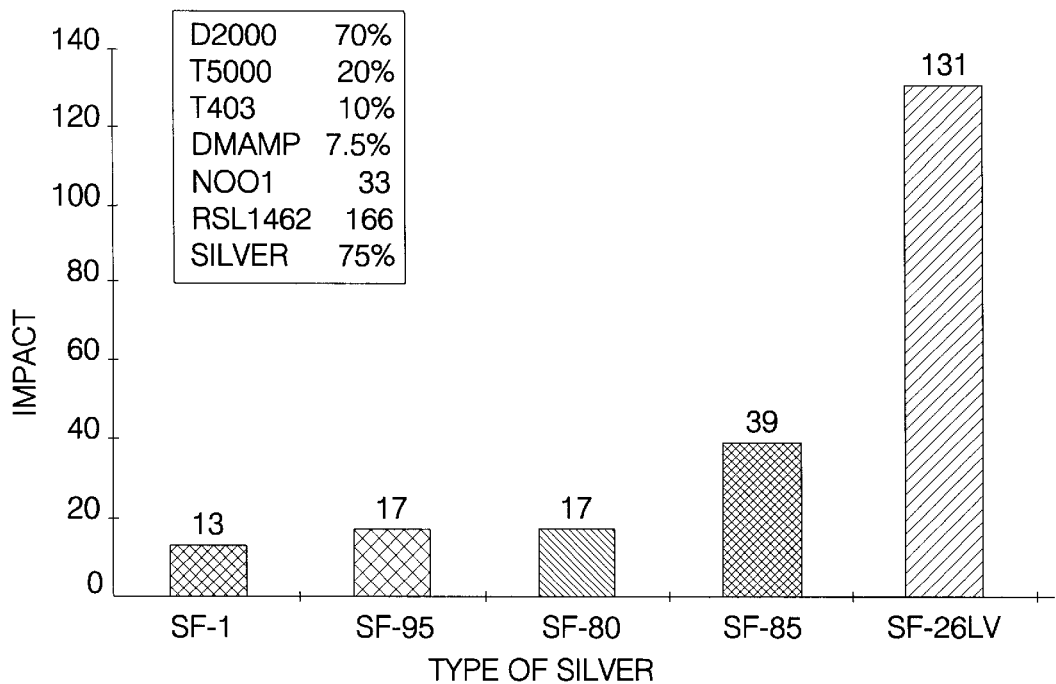
FIG. 3 is a graph illustrating the effects of five different types of silver flakes on the impact strength of an adhesive formulation of this invention.

One other aspect of this invention is the importance of the concentration and the characteristics of the silver flake component on the performance of the conductive adhesives. The influence of silver flakes is formulation dependent. Some silver flakes provide very low viscosity formulations, such as SF-26LV and SF-499. Others provide very thick pastes, such as SF-450 and SF-235. Silver flakes such as SF-80 and SF-299 in general generate formulations that have good viscosities and are more sensitive to formulation ingredients. Unless the viscosity of the epoxy resincurating system is very high, the use of low viscosity silver flakes (SF-26LV and SF-499) alone is not recommended because of particle settling behavior. Several factors determine the overall characteristic of any silver flake in an epoxy formulation. These include tap density, surface area, shape of particle, particle size and distribution, lubricant, ionic impurities, and other processing conditions. FIG. 3 shows the dependence of impact properties on the type of silver flakes in the formulation. Blends of silver flakes may be utilized to achieve certain desirable properties in a specific formulation such as change in viscosity, impact and electrical properties. Examples are shown in Tables 3, 4, 5 and 6.

Figure 4:
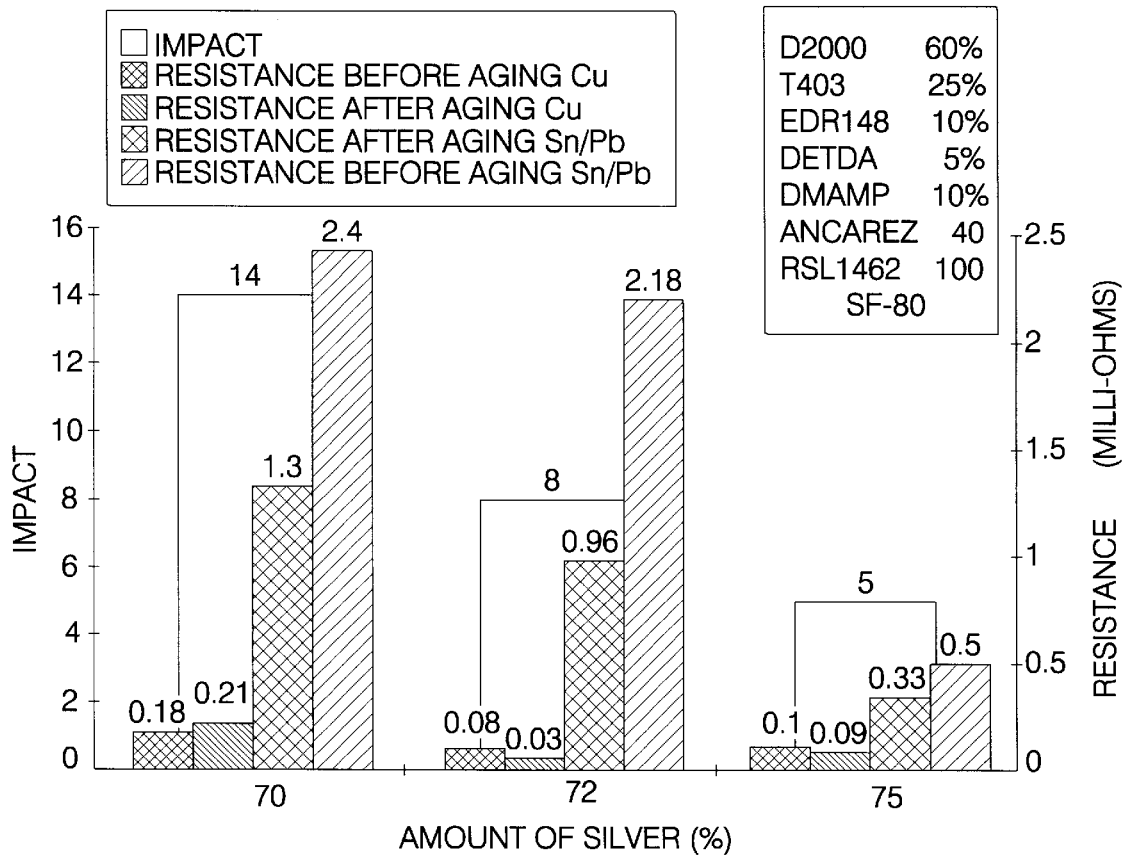
FIG. 4 is a graph illustrating the effect of amounts of SF-80 type silver flakes and the impact properties and electrical resistance stability of an adhesive formulation of this invention.

The cost of conductive adhesives will be determined primarily by the cost of silver. Any reduction in the amount of silver used would make these materials more attractive in a greater number of applications. While on the average, an amount of 75% by weight of silver is required to reach the desired electrical resistance values. This amount can be reduced in some formulations to less than 70% by weight without adversely affecting these properties. FIG. 4 shows the effect of the amount of silver on the impact properties and the electrical resistance of a given formulation (see also formulation B2 for additional example).

While this invention has been illustrated in terms of many specific examples, it will be appreciated that other forms could be developed by those skilled in the art. Accordingly, the scope of the invention is to be considered limited only by the following claims.

We claim:

1. An electrically-conductive epoxy resin comprising the polymeric reaction product of a spreadable mixture initially comprising in parts by weight (a) 100 parts of a liquid bisphenol A having an epoxide equivalent weight in the range of 170 to 280 and having a hydrolyzable chlorine content of 50 parts per million or less;

(b) a mixture of primary amines, the total amine content of which is substantially chemically equivalent to the epoxide content of said bisphenol A, comprising as a percentage of total primary amine content:

(i) 60 to 85 percent of one or more polyoxypropylene diamines or triamines of molecular weight 2000 to 5000, (ii) 5 to 40 percent of one or more polyoxypropylene diamines or triamines of molecular weight 230 to 450, (iii) 0 to 10 percent triethylene glycol diamine, and (iv) 0 to 10 percent diethyltoluene diamine;

(c) 5 to 20 percent of said primary amine content of a bisphenol A-polyoxypropylene diamine/triamine reaction accelerator, and (d) silver metal flakes in an amount in the range of 60 percent to 85 percent of the total metal flake-containing resin mixture.

2. An electrically conductive epoxy resin as recited in claim 1 in which said mixture additionally comprises 40 to 80 parts by weight, based on said 100 parts of liquid bisphenol A, of an acrylate group terminated urethane flexibilizer.

3. An electrically conductive epoxy resin as recited in claim 1 in which said mixture comprises up to 50 parts, based on said 100 parts of bisphenol A, of a 2,4,8,10-tetraoxaspiro (5,5) undecane-3,9-di-propanamine containing adduct, where the total bisphenol A content is increased by about two parts per part of said adduct.

4. An electrically conductive epoxy resin as recited in any of claims 1 through 3 in which said accelerator is an aromatic tertiary amine.

5. An electrically-conductive epoxy resin as recited in claim 4 is a tertiary amine selected from the group consisting of dimethylaminomethylphenol and N,N-dimethyl benzyl amine.

6. An electrically-conductive epoxy resin as recited in any of claims 1 through 5 in which the average size of said metal flakes is in the range of about 0.1 to 20 micrometers.

* * * * *